United States Patent [19]

Nakamura et al.

[11] 4,401,546

[45] Aug. 30, 1983

[54] FERROMAGNETIC HIGH SPEED SPUTTERING APPARATUS

[75] Inventors: Kyuzo Nakamura; Yoshifumi Ohta; Taiki Yamada, all of Yachimata, Japan

[73] Assignee: Nihon Shinku Gijutsu Kabushiki Kaisha, Kanagawa, Japan

[21] Appl. No.: 361,629

[22] Filed: Mar. 25, 1982

[30] Foreign Application Priority Data

Mar. 27, 1981 [JP] Japan ................................. 56/44132
Mar. 27, 1981 [JP] Japan ................................. 56/44133

[51] Int. Cl.$^3$ ............................................. C23C 15/00
[52] U.S. Cl. ............................... 204/298; 204/192 R; 204/192 M
[58] Field of Search ............... 204/192 R, 192 M, 298

[56] References Cited

U.S. PATENT DOCUMENTS

| | | | |
|---|---|---|---|
| 3,501,393 | 3/1970 | Wehner et al. | 204/298 |
| 4,049,857 | 9/1977 | Hammer | 204/298 |
| 4,158,589 | 6/1979 | Keller et al. | 204/298 |
| 4,162,954 | 7/1979 | Morrison | 204/192 R |
| 4,180,450 | 12/1979 | Morrison | 204/192 R |
| 4,198,283 | 4/1980 | Class et al. | 204/192 R |
| 4,200,510 | 4/1980 | O'Connell | 204/192 R |
| 4,239,611 | 12/1980 | Morrison | 204/298 |
| 4,299,678 | 11/1981 | Meckel | 204/298 |

OTHER PUBLICATIONS

Chapin, *The Planar Magnetism,* Vacuum Technology, Technical Publishing Company, Research, Development, Jan. 1974, pp. 37-40.

Vorous, Planar Magnetron Sputtering, *A New Industrial Coating Technique,* Vac-Tec Systems, Boulder, Colorado, pp. 62-66.

*Primary Examiner*—Arthur P. Demers
*Attorney, Agent, or Firm*—Armstrong, Nikaido, Marmelstein & Kubovcik

[57] ABSTRACT

A ferromagnetic, high-speed sputtering apparatus including an evacuable chamber, a substrate in the chamber, a target of ferromagnetic substance in the chamber facing the substrate, and magnetic field developing means in the chamber on the side of the target opposite the substrate. The target serves as a cathode. The target includes at least two separate segments of ferromagnetic substance which are spaced apart one from another by a gap so that a leakage magnetic field may be produced on the surface of the target facing the substrate. The gap may be less than about 3 mm. Each of the segments can include a ridge portion on the surface facing the substrate. Each ridge portion can have at least one apex and at least one slant surface.

3 Claims, 13 Drawing Figures

FERROMAGNETIC HIGH SPEED SPUTTERING APPARATUS

BACKGROUND OF THE INVENTION

This invention relates to a high-speed sputtering apparatus using a target of such ferromagnetic substance as Fe, Co, Fe-Ni, Co-Cr, Co-R, $Fe_3O_4$, $BaO.Fe_2O_3$ and so on.

An apparatus is previously known having an evacuated chamber provided therein with a target of ferromagnetic substance such as Fe or the like as a cathode. It is also known to provide a magnetic field developing means behind the target. This produces a leakage magnetic field on the surface of the target so that the plasma density may be increased.

However, this apparatus is liable to the disadvantage that in order to produce a parallel magnetic field on the surface of the target of such an intensity of about 200 Gauss (which is necessary for a high speed sputtering), it is necessary to make ferromagnetic the target relatively thin. Additionally, it is generally necessary to have the field developing means producing a magnetic field of an intensity more than the magnetic saturation value of the target. This results in the wearing and consumption of the target being accelerated. Consequently, its life is lowered. Namely, for instance, in a case where a barium-ferrite magnet is used as a magnetic field developing means, an Fe target in the form of a plate is used for the ferromagnetic substance target and these are brought into mutually contacting condition, the thickness of the Fe target has to be made less than 1.4 mm in order to obtain a leakage magnetic field of about 200 Gauss on the surface of the target.

When a Cu backing sheet is provided on the back of the Fe target for reinforcing the same, the thickness of the Fe target has to be made less than 0.7 mm. In these cases, the life of use of the target becomes very short, which is undesirable.

OBJECTS AND SUMMARY OF THE INVENTION

It is an object of the present invention to provide a ferromagnetic high-speed sputtering apparatus which includes a ferromagnetic target having a longer life.

It is a further object of the present invention to provide an apparatus which does not require a magnetic field developing means producing a magnetic field of an intensity more than the magnetic saturation value of a ferromagnetic target.

It is still a further object of the present invention to reduce the wearing and consumption of a ferromagnetic target.

These and other objects are accomplished in a ferromagnetic, high-speed sputtering apparatus comprising an evacuable chamber, a substrate in the chamber, a target of ferromagnetic substance in the chamber facing the substrate and magnetic field developing means in the chamber on the side of the target opposite the substrate. The target serves as a cathode. The target comprises at least two separate segments of ferromagnetic substance which are spaced apart one from another by a gap. In this manner, a leakage magnetic field is produced on a surface of the target facing said substrate.

Preferably, the gap is less than about 3 mm.

Each of the segments can include a mountain-formed or ridge portion on the surface facing the substrate. Each mountain-formed or ridge portion has at least one slant surface.

The ridge portion can have at least one apex.

DETAILED DESCRIPTION OF PREFERRED EMBODIMENTS

Figure 1:
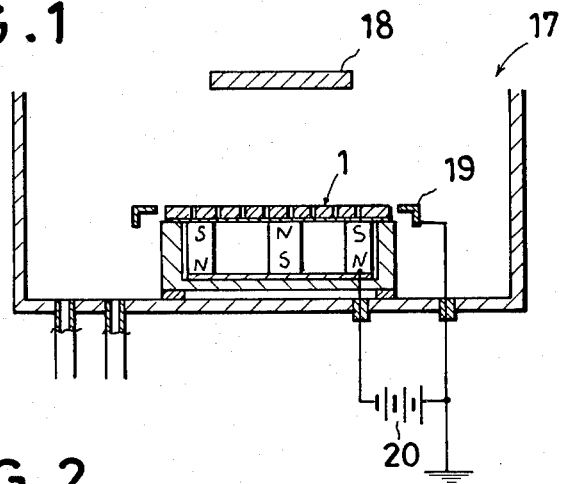
FIG. 1 is a sectional side view, partly omitted of one embodiment of the present invention.
Figure 2:
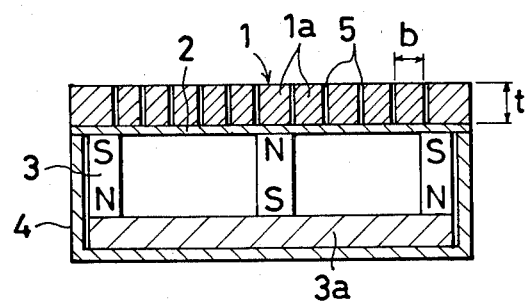
FIG. 2 is a sectional view of a portion of the same.
Figure 3:
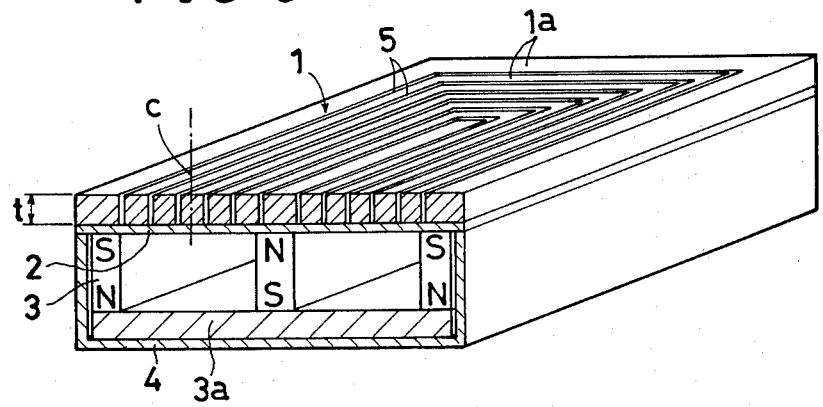
FIG. 3 is a perspective view, partly omitted, of the embodiment of FIG. 1.

Referring to FIGS. 1, 2 and 3, a target 1 made of a ferromagnetic substance such as Fe or the like is so provided in an evacuable chamber 17 as to face a substrate 18. A backing plate 2 of a nonferromagnetic substance such as copper is provided on the rear surface of the target 1. A magnetic field developing means 3 made of a barium ferrite magnet or the like is provided on the back of the plate 2. A water cooling means 4 made of nonferromagnetic substance is provided surrounding the magnetic field developing means 3 and provides cooling water. A yoke 3a holds the magnetic field developing means 3. When a cathode potential is applied to the target, the target is sputtered so that fine particles of the same are deposited on the substrate. An anode 19, and a D.C. source 20 are also provided.

The above construction is not different especially from a conventional sputtering apparatus. According to this invention, the ferromagnetic substance target 1 is constructed by a plurality of segments of ferromagnetic substance 1a which are disposed so as to be spaced apart from one another by a small gap 5 between every mutual adjacent ones thereof.

Figure 4:
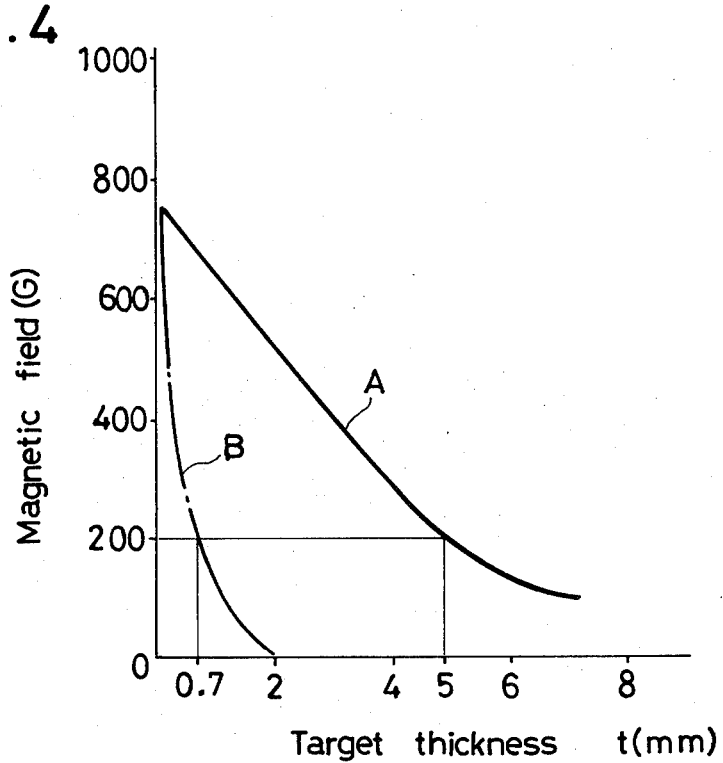
FIG. 4 is a diagram showing the characteristics curves of a leakage magnetic field utilizing the embodiment of FIG. 1.

In the case shown in FIGS. 1, 2, and 3, each segment of ferromagnetic substance 1a is formed as an annular body which is a rectangular form in section and is 5 mm in width b. The plurality is disposed fixedly on the backing plate 2 as to leave a small annular gap 5 of 1 mm between each adjacent segment. Behind the Fe target 1 of such size and shape as above, a magnetic field developing means 3 is provided comprising barium ferrite magnets 3. Curve A, shown in FIG. 4, is obtained by measuring the intensity of the magnetic field in the horizontal direction at a point c which is the central position between the magnetic poles thereof, and which is at a height of 3 mm from the surface of the target 1 with the thickness t of the target 1 being varied. In contrast thereto, curve B shows the result of measuring of the intensity of the magnetic field in a case of a conventional target made of Fe in the form of a plate having a continuous surface, with the thickness thereof being varied. In respect of the intensity G of the magnetic field, the curve B is lower than the curve A except for the case where the thickness of the target is 0 mm, that is, where only the backing plate alone exists. In order to produce a leakage magnetic field of such an intensity of above about 200 Gauss (which is necessary for a high speed sputtering), the thickness of a conventional target has to be 0.7 mm or less. If the target is more than 2 mm, magnetic saturation thereof cannot be obtained, so that a leakage magnetic field leaking on the surface thereof cannot be produced. However, in the case of this invention, even if the thickness of the target 1 is a little less than 5 mm, a leakage magnetic field of about 200 Gauss can be obtained. This thickness of 5 mm is a comparative thick one, the same can be durable for a comparatively long sputtering time. Additionally, a magnetic developing means 3 having a magnetic field intensity which is lower than a magnetic saturation value thereof can be used.

Figure 5:
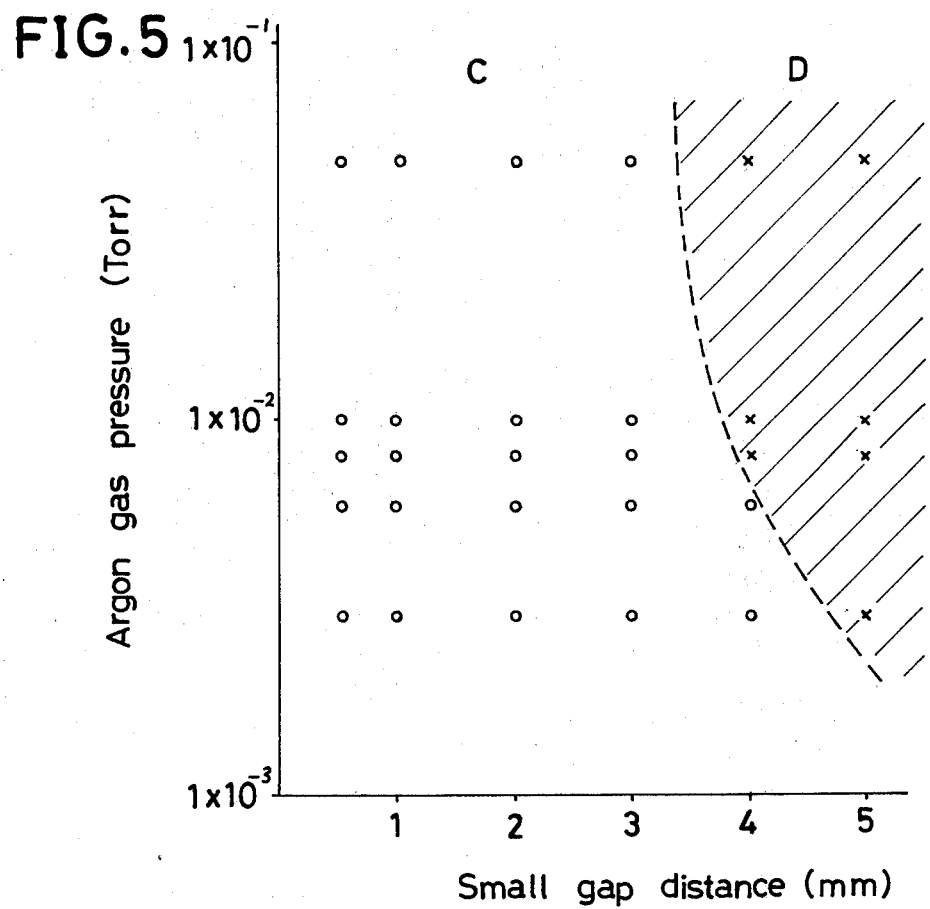
FIG. 5 is a diagram showing the relationship between the gap size and the pressure within the evacuable chamber showing the conditions when the plasma formed in the chamber enters into the gaps.

If the small gap 5 formed between the ferromagnetic substance segments 1a, 1a is too large, plasma enters the same. As a result, the backing plate 2 is sputtered by the same and the sputtered particulates are deposited on the substrate as a foreign matter, which is unfavorable. However, as shown by a region c in FIG. 5, if the small gap 5 is made less than about 3 mm, the plasma cannot enter the small gap 5 regardless of Argon pressure values. As a result, the backing plate 2 cannot be sputtered thereby. A region D shown in the same Figure denotes that within which there takes place the entering of the plasma.

Figure 6:
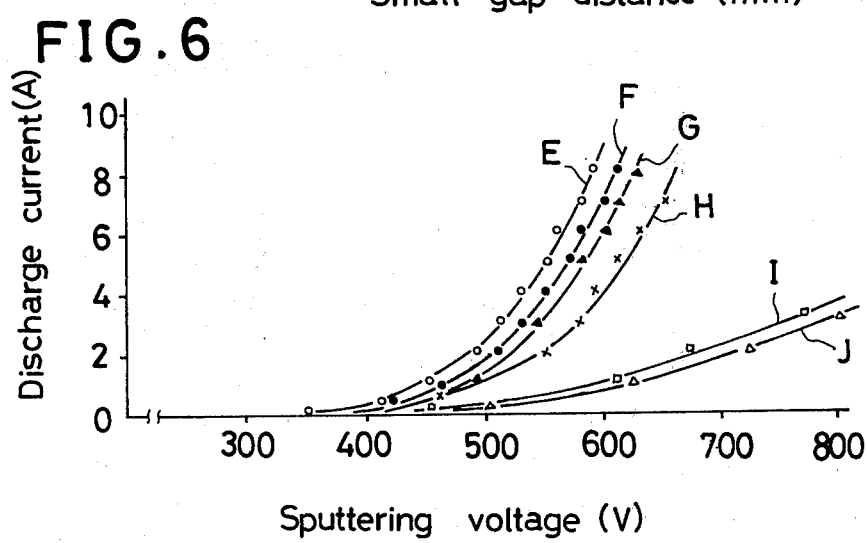
FIG. 6 is a diagram showing the characteristics curves of the electric discharge current relative to the voltage.

An electric discharge characteristic property in the case of the ferromagnetic substance segment 1a in a square form which is 5 mm thick and 5 mm wide, is shown by curves E-J in FIG. 6. It can be understood therefrom that a high discharge peculiar to a high speed sputtering can be obtained by such a target.

In this Figure, the curve E is obtained in the case of the Argon gas pressure of $1 \times 10^{-2}$ Torr, curve G is in $5 \times 10^{-3}$, H is in $3 \times 10^{-3}$, I is in $1 \times 10^{-3}$ and J is in $5 \times 10^{-4}$, respectively. In the case of the curve G, a deposit speed of 6100 Å/min. is obtained with 630 V and 8 A.

Figure 7:
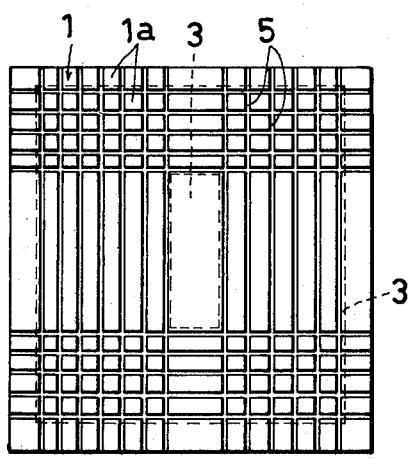
FIG. 7 is a plan view of a second embodiment of the present invention.
Figure 8:
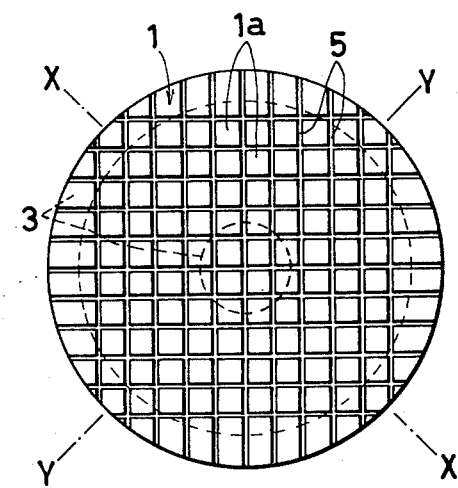
FIG. 8 is a plan view of a third embodiment of the present invention.

As another measure for forming the small gap 5, it can be considered that after the flat plate-formed target of ferromagnetic substance is bonded to the backing plate, the target 1 is cut or machined so that there is formed a large number of plural small gaps of a lattice formation as shown in FIG. 7 or FIG. 8, respectively. Consequently, the target 1 is so constructed as to have a large number of the small square form segments of ferromagnetic substance. In the arrangement shown in FIG. 8, the small gaps 5 are not at right angles to the magnetic field in the X-X direction and the Y-Y direction. However, a magnetic field is produced in those directions corresponding to a composite of vectors of lines of the leakage magnetic field leaked from those small gaps crossing the magnetic field developed by the target. Therefore, there takes place as a whole no trouble at all with the whole target 1 in the practical use.

Figure 9:
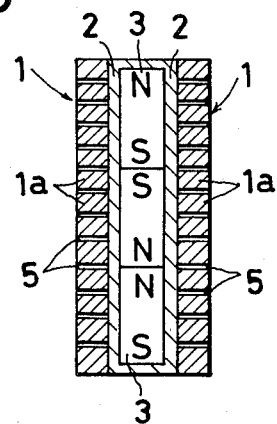
FIG. 9 is a sectional-side view of a fourth embodiment of the present invention.

Furthermore, this invention apparatus may be so modified that plural magnets constituting the magnetic field developing means 3 are disposed in an axial vertical direction and plural ferromagnetic substance annular segments 1a are disposed so as to leave the small gap 5 between each adjacent one and to surround the developing means 3 so that a tubular body of the ferromagnetic substance target 1 suitably used for a coaxial type sputtering apparatus is formed as shown in cross-section in FIG. 9.

In addition, according to this invention, this invention apparatus is such a one that a mountain-formed or ridge portion 7 having slant surfaces 6,6 is provided on the surface of each of the small segments of ferrromagnetic substance 1a so that the slant surfaces 6 thereof may serve as sputtering surfaces for gradually being sputtered and consumed.

Figure 10:
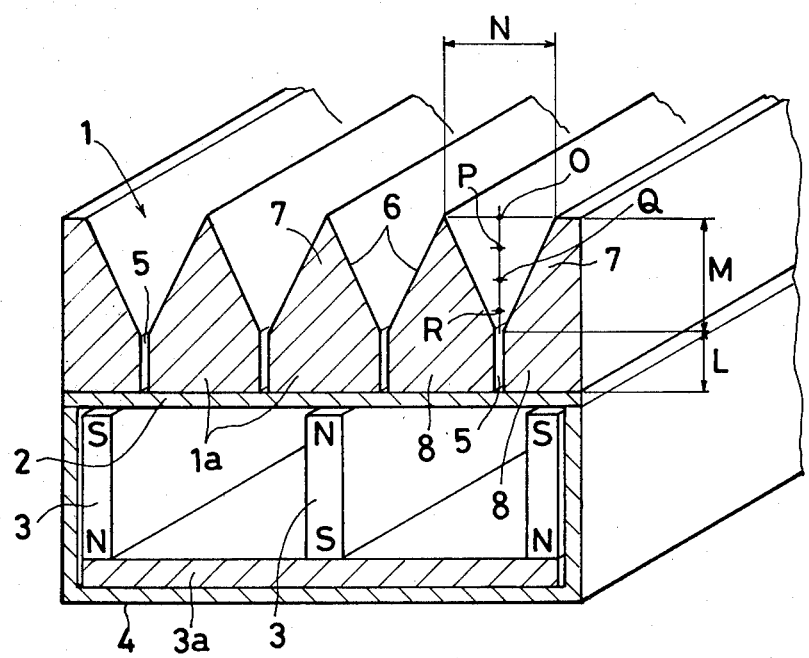
FIG. 10 is a perspective view of a variation of the present invention, which may be utilized on any of the above four embodiments in which a mountain-formed or ridge portion having at least one slant surface is formed on the surface of each of the segments.

One embodiment of this variation of the invention is shown in FIG. 10. In this case, the magnetic field developing means 3 is composed of barium-ferrite magnets. Each of the small segments of Fe ferromagnetic substance 1a is so sized that the height L of the base portion 8 thereof is 5 mm and the height M of the ridge portion 7 is 20 mm. In addition, the respective ferromagnetic segments 1a, 1a are so disposed on the backing plate 2 that the distance of the space N between the adjacent ridge portions 7,7 may become 20 mm.

Figure 11:
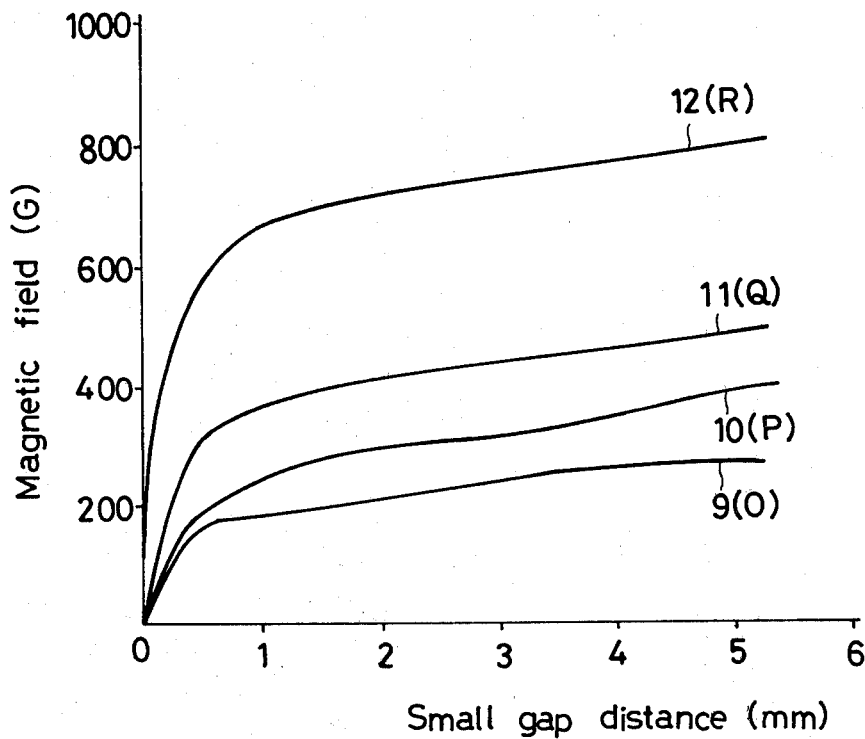
FIG. 11 is a diagram showing the characteristics curves of a leakage magnetic field of the variation of FIG. 10.

In this apparatus, with the gap 5 between the adjacent base portions 8, 8 being varied, measuring of the intensity of the magnetic field above the gap 5 is carried out at respective points O, P, Q and R located, at respective 5 mm interval relationship, in the space formed between the slant surfaces of the adjacent mountain-formed portions 7,7. As a result, curves 9, 10, 11, 12 shown in FIG. 11 are obtained.

The curve 9 depicts the intensity of the magnetic field at the measured point O, and the curves 10, 11, 12 depict the intensities of the magnetic field at the respective points P, Q, R. As clear therefrom, if the distance of the small gap 5 is zero, that is, the base portions 8,8 are brought into contact with each other to become continuous one to another, the magnetic field intensities at all the measured points become less than 2 Gauss, which is below the ability of most instruments to measure. In this continuous contact condition, the Fe ferromagnetic substance segment 1a does not reach magnetic saturation thereof. It can be also understood therefrom that when the small gaps 5 become gradually wider, the magnetic field intensities at all the points abruptly rise and thereafter are gradually increased. Even in the case that the gap distance is as very small as 0.5 mm or so, there can be obtained such large leakage magnetic field force as 170 G at the O point and 600 G at the point R. Thus, even in a magnetic field which is below the magnetic saturation value, a sufficiently strong leakage magnetic field can be obtained.

Figure 12:
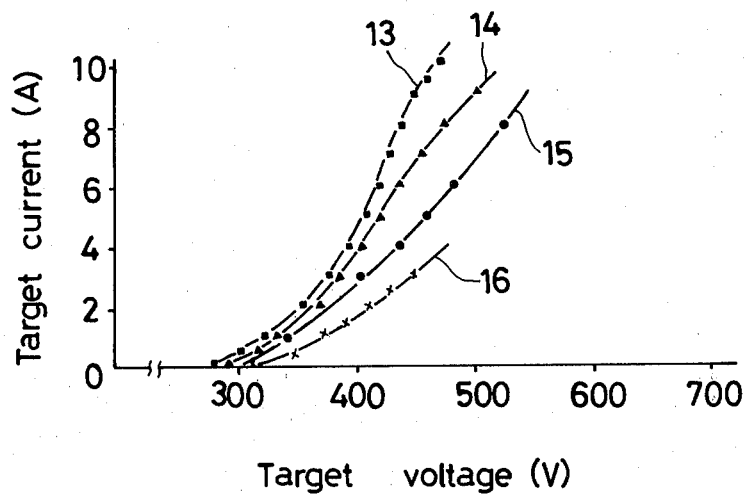
FIG. 12 is a diagram showing the characteristics curves of the discharge current versus the voltage of the variation of FIG. 10.

Furthermore, where the distance of the gap 5 is set to be 1 mm, an electric discharge characteristic property is measured and the results thereof are shown in FIG. 12. In this case, the above measurement is made in such conditions that the size of the target 1 is made 5×8 inches, and the DC sputtering is carried out.

In the same Figure, a curve 13 is obtained in the case of an Argon gas pressure of $1\times10^{-2}$ Torr, and curves 14, 15 and 16 are obtained in the respective cases of the same gas pressures of $7\times10^{-3}$, $5\times10^{-3}$ and $1\times10^{-3}$ Torr. It can be understood therefrom that in the respective cases high electric discharge currents peculiar to the high-speed sputtering can be obtained. Also in the case of the curve 14, in the conditions of 500 V and 9 A, a deposit speed on the substrate becomes 4500 Å/min. which is more than 10 times that in a common RF sputtering.

Figure 13:
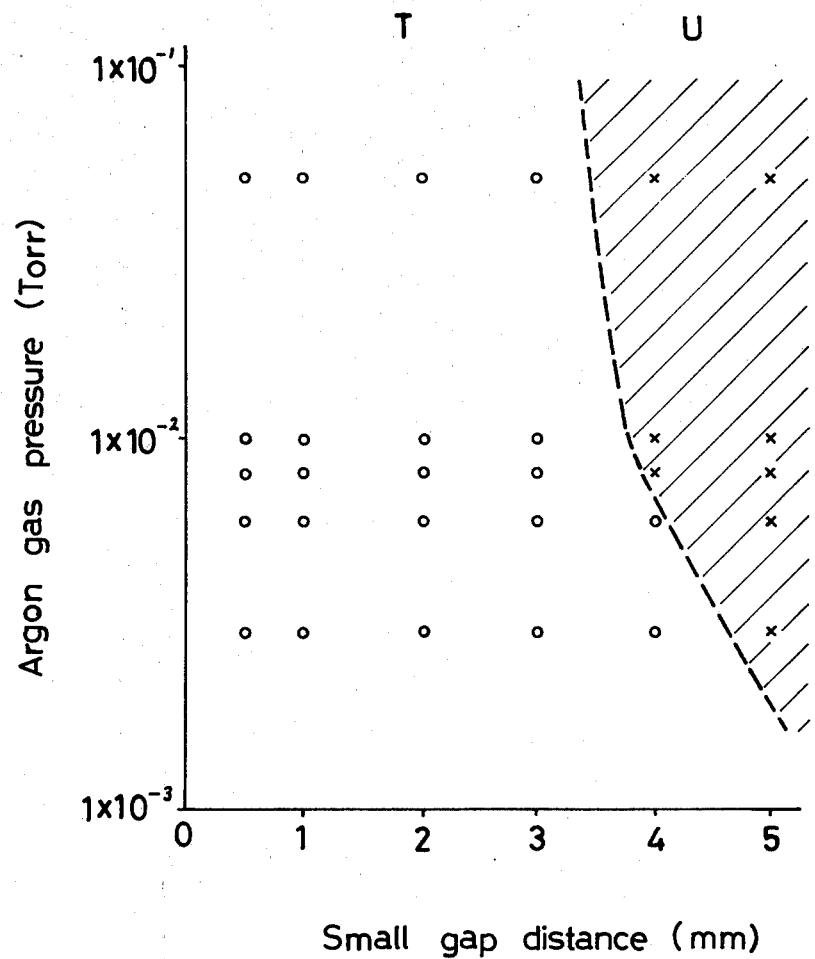
FIG. 13 is a diagram showing the relationship between the gap and the pressure within the evacuable chamber showing the conditions when the plasma formed in the chamber will enter into the gaps.

With increase in the distance of the foregoing small gap 5, the leakage magnetic field on the surface of the target 1 is increased, but if the distance thereof becomes too large, the plasma enters the gap 5, and sputters the backing plate 2, which becomes the cause of inclusion of the impurities in a deposit product. However, if the small gap 5 is set to be less than about 3 mm, the plasma does not enter the gap 5, so that the backing plate 2 is never sputtered as shown by a region T in FIG. 13. A symbol U in the same Figure denotes a region within which the plasma entering is observed. The operation of this invention apparatus will be explained as follows:

The magnetic field developed from the magnetic field developing means 3 which acts on the ferromagnetic substance made target 1 from behind is leaked on the surface of the target as a comparatively strong leakage magnetic field due to the target 1 being constructed as a plurality of the mutually spaced-apart segments of ferromagnetic substance 1a. When the target is sputtered by applying the cathode potential to the target, the plasma density is increased by the leakage magnetic field, so that high speed sputtering of the ferromagnetic segments of the target 1 can be carried out.

In addition, in the case of a target in which each of the segments 1a is provided at its surface with a ridge portion 7 having at least one slant surface 6, the sputtering surface is increased and at the same time the volume of each segment 1a is increased by the ridge portion 7, and there can be provided the target which can be durable to sputtering for a longer time.

Thus, according to this invention, a target of ferromagnetic substance is constructed by at least two segments disposed to be spaced from one another by a small gap, so that even when the magnetic field intensity of a magnetic field developing means located behind the target is below a magnetic saturation value, there can be produced a comparatively large leakage magnetic field thereof on the surface of the target. Accordingly, a magnetic field developing means which develops a comparatively weak magnetic field and which is not expensive can be used. Also, the thickness of the target can be increased to 5–7 times that of a conventional target in a continuous plate form, so that the durability of the target is improved and sputtering of the target of ferromagnetic substances can be carried out continuously and at a good efficiency. In addition, by providing a ridge portion on the surface of each of the ferromagnetic segments a durable long life target is obtained.

It is readily apparent that the above-described ferromagnetic, high-speed sputtering apparatus meets all of the objects mentioned above and also has the advantage of wide commercial utility. It should be understood that the specific form of the invention hereinabove described is intended to be representative only, as certain modifications within the scope of these teachings will be apparent to those skilled in the art of high-speed sputtering apparatuses.

Accordingly, reference should be made to the following claims in determining the full scope of the invention.

What is claimed is:

1. A ferromagnetic, high-speed sputtering apparatus comprising an evacuable chamber, a substrate in said chamber, a target of ferromagnetic substance in said chamber facing said substrate, said target serving as a cathode, and magnetic field developing means in said chamber on the side of said target opposite said substrate, said target comprising at least two separate segments of ferromagnetic substance which are spaced apart one from another by a gap so that a leakage magnetic field may be produced on a surface of the target facing said substrate.

2. The apparatus of claim 1, wherein each of said segments includes a ridge portion on said surface facing said substrate, each ridge portion having at least one apex and at least one slant surface.

3. The apparatus of either claim 1 or 2, wherein said gap is less than about 3 mm.

* * * * *